United States Patent [19]

Gould et al.

[11] Patent Number: 4,786,613

[45] Date of Patent: Nov. 22, 1988

[54] METHOD OF COMBINING GATE ARRAY AND STANDARD CELL CIRCUITS ON A COMMON SEMICONDUCTOR CHIP

[75] Inventors: Elliot L. Gould, Colchester; Douglas W. Kemerer, Essex Junction; Lance A. McAllister, Williston; Ronald A. Piro, South Burlington; Guy R. Richardson, Milton; Deborah A. Wellburn, Colchester, all of Vt.

[73] Assignee: International Business Machines Corporation, Armonk, N.Y.

[21] Appl. No.: 18,239

[22] Filed: Feb. 24, 1987

[51] Int. Cl.$^4$ .................................... H01L 21/38
[52] U.S. Cl. ............................ 437/48; 437/8; 437/74; 437/141
[58] Field of Search ................ 437/48, 74, 141, 8

[56] References Cited

U.S. PATENT DOCUMENTS

| | | | |
|---|---|---|---|
| 814,122 | 9/1906 | Blachere et al. | |
| 4,412,237 | 10/1983 | Matsumura et al. | 357/42 |
| 4,513,307 | 4/1985 | Brown | 357/42 |
| 4,562,453 | 12/1985 | Noguchi et al. | 357/44 |
| 4,570,176 | 2/1986 | Kolwicz | 357/42 |
| 4,589,007 | 5/1986 | Kuboki et al. | 357/45 |

FOREIGN PATENT DOCUMENTS 60-177650 9/1985 Japan .

OTHER PUBLICATIONS

R. Putatunda et al., "HAPPI: A Chip Compiler Based on Double-Level-Metal Technology", 23rd Design Automation Conf., paper 41.4, pp. 736-743, 1986.

R. Donze et al., "Philo—A VLSI Design System", Design Automation Conf., Las Vegas, Nev., Jun. 1982, pp. 163-169.

R. Walker et al., "Structured Arrays—A New ASIC Concept Provides the Best of Gate Arrays and Cell Based Custom", IEEE 1985 Customer Integrated Circuits Conf., pp. 252-257, 1985.

K. Pierce et al., "Configurable 6845 Megacell Incorporated with 2UM CMOS Gate Array", IEEE 1986 Customer Integrated Circuits Conf., pp. 565-567, 1986.

T. G. Matheson et al., "A Software Environment for Building Core-Microcomputer Compilers", IEEE Intl. Conf. on Computer Design, pp. 221-224, Oct. 7-10, 1985.

M. R. Burich, "Programming Language Makes Silicon Compilation a Tailored Affair", Electronics Design, pp. 135-142, Dec. 12, 1985.

Primary Examiner—George T. Ozaki
Attorney, Agent, or Firm—Stephen J. Limanek

[57] ABSTRACT

A method and semiconductor structure are provided for intermixing circuits of two or more different cell classes, such as standard cells and gate array cells, on a common chip or substrate with minimum ground rule separation between adjacent cells of different classes. Cell locations are defined with given boundaries and contiguosuly arranged on the surface of a semiconductor chip, and then either standard cell type or gate array type circuits are formed within any of the cell locations to provide a structure for balancing the chips density and performance versus hardware turn-around-time.

27 Claims, 4 Drawing Sheets

METHOD OF COMBINING GATE ARRAY AND STANDARD CELL CIRCUITS ON A COMMON SEMICONDUCTOR CHIP

TECHNICAL FIELD

This invention relates to a method of making standard cells and gate array cells on a common semiconductor chip or wafer and, more particularly, to a method of making logic products with optimal density while retaining the ability to implement rapid turn-around-time for design changes.

BACKGROUND ART

There are two major classes of cells, sometimes called application specific integrated circuits (ASIC), commonly used to allow designers to place large numbers of logic circuits on a single or common very large scale integrated (VLSI) chip. One of these classes or types of cells is known as a standard cell, wherein each logical function, which may be referred to as a book, is implemented as a custom designed circuit which can then be placed in a predefined area or cell boundary anywhere on the chip and be wired to other functions, circuits or books. In this standard cell approach, the sizes of the devices or transistors and the layout of the circuits are optimized for each logical function or book so that density and performance characteristics are nearly comparable to a custom designed chip. In the standard cell, most or all steps in the fabrication of the wafer or chip are personalized for each particular design. Thus, if any changes are to be made to the design, an entirely new mask must be made for every personalized step in the fabrication process and the fabrication must again begin from a bare semiconductor, e.g., silicon, wafer. Standard cells are discussed in some detail in an article entitled, "HAPPI: A Chip Compiler Based On Double-Level-Metal Technology" by R. Putatunda et al, 23rd Design Automation Conference, paper 41.4, pp. 736-743, 1986, and in an article entitled, "Philo, A VLSI Design System" by R. Donze, Design Automation Conference, Las Vegas, Nev., June 1982, pp. 163-169.

In contrast to the standard cell, gate array cells are not personalized until the fabrication process reaches the first contact level to the conductive material which interconnects the devices or transistors in the gate array cell for a particular design. That is, a gate array chip is formed by making rows of transistors, P-channel and N-channel transistors if complementary metal oxide semiconductor (CMOS) technology is used, arranged in cells on the surface of the chip. For each discrete logic function available in the library of books for the chip, a personality of conductors is defined in a known manner which interconnects the devices or transistors located within one or more cells to perform a desired function, such as inverting or latching. Any logical function implemented on the gate array chip uses the same set of background devices or transistors and, if any changes are to be made in the circuit, only the last few steps, the conductor and contact steps, in the fabrication process need to be altered to rearrange the interconnections. By using the gate array cell approach, both initial designs and later modifications can be obtained more quickly and cheaply than in a standard cell design, though with some impact to chip performance and density when compared to that of the standard cell. Gate array cells are discussed in some detail in U.S. Pat. No. 4,412,237 by N. Matsumura et al, filed on Dec. 11, 1978 and issued on Oct. 25, 1983, and U.S. Pat. No. 4,589,007 by S. Kuboki et al, filed Sept. 6, 1983, and issued May 13, 1986, and in commonly assigned U. S. patent application having Ser. No. 814,122, filed on Dec. 27, 1985, by J. Blachere et al and entitled, "Multi-Functional Prediffused Arrays in CMOS Technology."

In a standard cell design, each book or functional circuit is laid out on the surface of the chip within one or more cells following boundary restrictions defining active circuit areas which allow it to be placed next to any other book or member of the library without interference between them. The boundary restrictions are determined by ground rules dependent upon the technology used to make the chip. In standard cell chips the region between active circuit areas is generally converted into an insulating region, such as a thick oxide, to provide isolation between books. In gate array cell design, each book is also laid out on the surface of the chip within one or more cells except that each book is essentially only an arrangement of interconnections to the transistors located within the one or more cells, but again each book must not interfere with a neighboring or adjacent book or circuit. Gate arrays typically use gate or electrical isolation techniques rather than oxide isolation to prevent adjacent books from interfering with each other. In the gate isolation technique, interconnections are included in each book to turn off the background transistors at one end of the book so as to electrically isolate adjacent diffusion nodes or regions. The gate isolation technique has been shown to provide improved density over that obtained by placing thick oxide isolation between adjacent diffusion nodes or regions, because the book designer is provided increased flexibility when connecting transistors for a particular circuit. Gate or electrical isolation is discussed in some detail in U.S. Pat. No. 4,562,453 by T. Noguchi et al, filed Nov. 8, 1982, and issued Dec. 31, 1985, and U.S. Pat. No. 4,570,176 by K. D. Kolwicz, filed Apr. 16, 1984, and issued Feb. 11, 1986.

In U.S. Pat. No. 4,513,307 by J. L. Brown, filed May 5, 1982, and issued Apr. 23, 1985, there is disclosed a CMOS gate array which uses two different cell layouts on the same chip to improve the utilization of background transistors. The gate array contains a continuing pattern of two sets of three series connected transistors in a cell surrounded by cells each containing two single transistor gates of each channel type.

An intermix of cells or circuits on a common chip to improve performance and to reduce the occupation area of semiconductor circuits is disclosed in Japan Patent No. 60-177650 dated Sept. 11, 1985. Other references disclosing an intermix of cells or circuits may be found in IEEE 1985 Custom Integrated Circuits Conference, pp. 252-257, "Structured Arrays—A New ASIC Concept Provides the Best of Gate Arrays and Cell Based Custom" by R. Walker et al and in IEEE 1986 Custom Integrated Circuits Conference, pp. 565-567, "Configurable 6845 Megacell Incorporated With 2 UM CMOS Gate Array" by K. Pierce et al.

As can be appreciated, the design and fabrication of any of the dense logic chips referred to hereinabove requires very complex processes. To assist in these processes, a considerable number of process steps have been automated and controlled by computers. Some procedures and equipment used to assist in the fabrication of such logic chips is disclosed, e.g., in Proceedings of the IEEE International Conference on Computer Design, pp. 221-224, Oct. 7-10, 1985, "A Software Environment for Building Core - Microcomputer Compilers" by T. G. Matheson et al, and in Electronic Design, pp. 135-142, Dec. 12, 1985, "Programming Language Makes Silicon Compilation A Tailored Affair" by M. R. Burich.

In the logic design technology, it is desirable to provide standard cells with the highest possible circuit density and high utilization of chip surface area while providing a process or method which can rapidly modify sections of the chip as required without significantly altering the original standard cells.

DISCLOSURE OF THE INVENTION

It is, therefore, an object of this invention to provide a method of making a logic chip with a high utilization of chip surface area, with high performance and with high circuit density, yet designed with rapid hardware turn-around time.

In accordance with the teaching of this invention, a method or process is provided for making a logic chip which includes the steps of defining a plurality n of cell locations, each having a boundary, within a semiconductor chip, forming standard cell circuits within $n-x$ of the plurality n of cell locations, where x is a smaller number than n, x cell locations being unoccupied, each of the standard cell circuits being disposed within an active circuit area spaced at least a given distance from the boundary of its associated cell location, and forming a plurality of gate array cells within the unoccupied cell locations, the plurality of gate array cells being equal to or less than x, each of the gate array cells having an active circuit area spaced at least the given distance from the boundary on one side of its associated cell location and extending without the boundary on the side of its associated cell location opposite to that of the one side for a distance at least equal to the given distance to contact the active circuit area of an adjacent one of the plurality of gate array cells and extending within the opposite boundary so as to be spaced therefrom by at least the given distance when one of the standard cells is disposed adjacent to the opposite boundary.

The foregoing and other objects, features and advantages of the invention will be apparent from the following more particular description of preferred embodiments of the invention, as illustrated in the accompanying drawings.

BEST MODE FOR CARRYING OUT THE INVENTION

Figure 1:
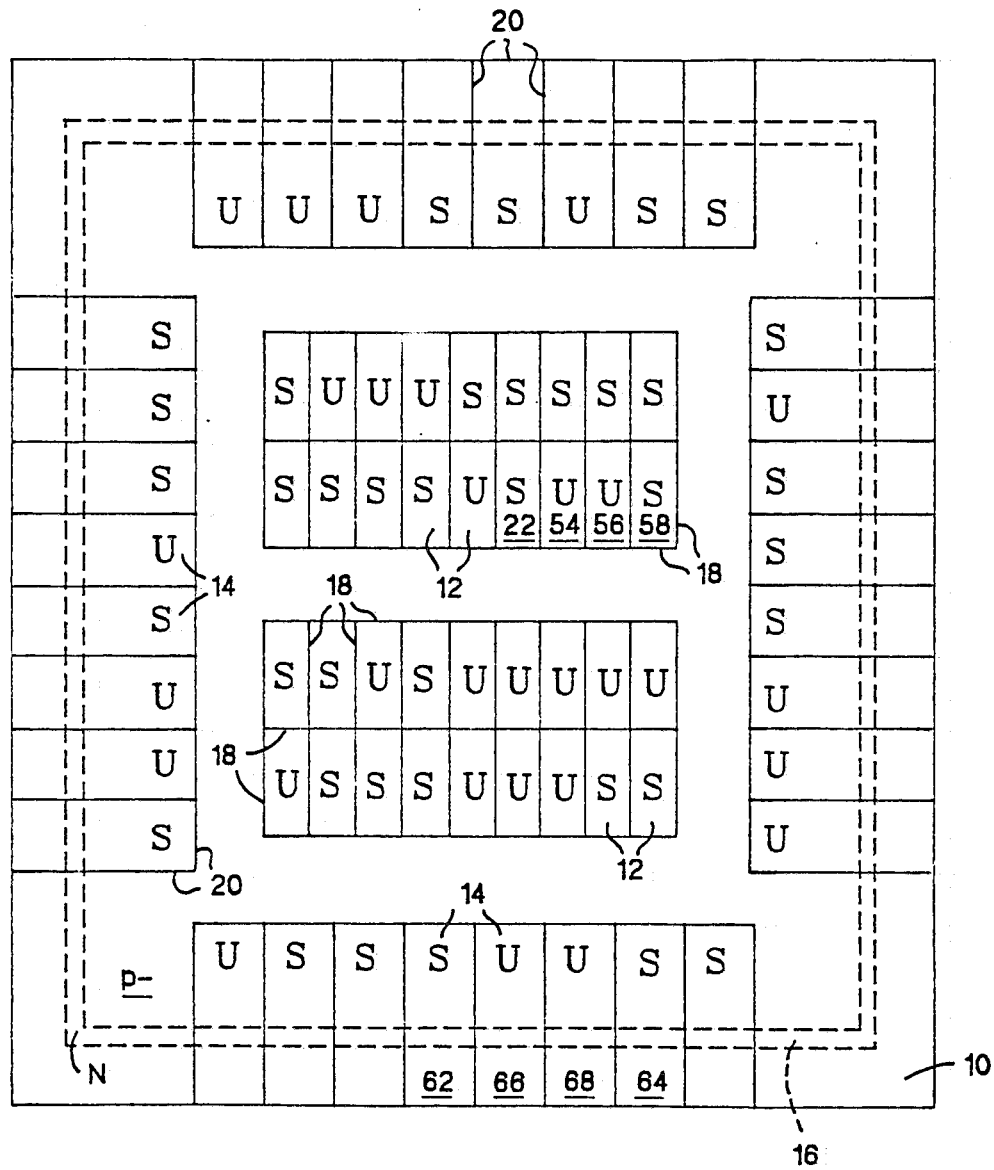
FIG. 1 is a plan view illustrating the topology of a semiconductor chip generally populated with standard cells.

Referring now to FIG. 1 of the drawings in more detail, there is illustrated in plan view a standard cell chip 10 for forming logic circuits in CMOS technology. The chip includes inner cell locations 12 wherein logic circuits, such as NANDs, inverters and latches, are made and outer cell locations 14 wherein input/output (I/O) circuits are provided. A guard ring 16 is formed along the periphery of the chip in a known manner so as to eliminate or minimize latchup problems associated with CMOS circuits. In a preferred embodiment of the chip, the body of the chip or substrate 10 is made of P-type silicon and the guard ring 16 includes an N-type impurity. The letter S in the cell locations 12 and 14 indicates that a standard cell circuit has been formed in that location and the letter U in the cell locations 12 and 14 indicates cell locations that are unused due to the nature of the particular circuits required in the standard cell chip 10. Each of the inner cell locations 12 has a boundary defined by lines 18 and each of the outer cell locations 14 has a boundary defined by lines 20. Although not shown, it should be understood that the input/output (I/O) circuits in the outer cell locations 14 are interconnected with the logic circuits formed in the inner cell locations 12. A particular logic circuit occupying one of the inner cell locations 22 will be described in more detail hereinbelow.

Figure 2:
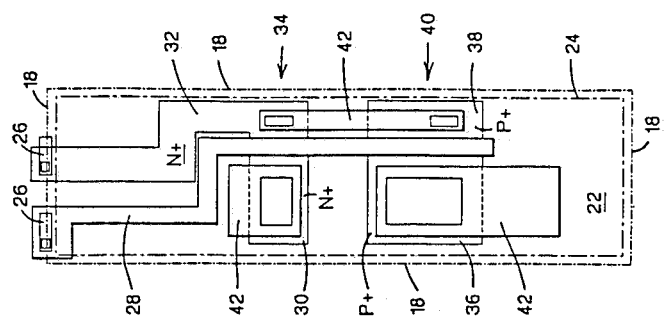
FIG. 2 is an enlarged plan view illustrating a circuit formed in one of the standard cells of FIG. 1.

In FIG. 2 of the drawings, there is shown in some detail an example of a standard cell circuit, in this instance an inverter circuit, disposed within the inner cell location 22 in the chip 10 illustrated in FIG. 1. An active circuit area having a border 24 is disposed within the boundary 18 of the inner cell location 22 except at the upper portion of the location 22 where logic service terminals 26 are disposed so as to be connected to other logic service terminals located at other cell locations. A given distance is provided between the cell location boundary 18 and the active circuit area border depending upon the technology used to make the circuits in the chip 10. The given distance may be considered to be ½ the distance of an established ground rule. As can be seen in FIG. 2, the inverter in cell location 22 includes a gate electrode 28, which is preferably made of doped polysilicon, and N+source and drain regions 30 and 32, respectively, to form an N-channel transistor 34, and P-type source and drain regions 36 and 38, respectively, to form a P-channel transistor 40. Metal segments 42 are provided to make appropriate electrical connections.

Figure 3:
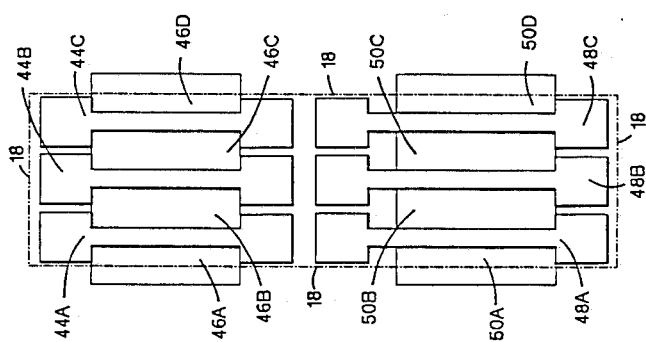
FIG. 3 is a plan view illustrating the topology of a known gate array cell with a conventional cell boundary.

In FIG. 3 of the drawings, there is illustrated a known gate array cell, e.g., of the type disclosed in the hereinabove referenced commonly assigned U.S. patent application Ser. No. 814,122, having a boundary similar in shape and size to that indicated in FIGS. 1 and 2 at 18 and, therefore, identified by the same reference number 18. Formed within the gate array cell are three N-channel field effect transistors and three P-channel field effect transistors. The three N-channel field effect transistors include doped polysilicon gate electrodes 44A, B and C and N+source/drain diffusion regions 46A, B, C and D and the three P-channel transistors include doped polysilicon gate electrodes 48A, B and C and P-type source/drain diffusion regions 50A, B, C and D. It can be seen from FIG. 3 of the drawings that the diffusion regions 46A, 46D, 50A and 50D extend to or beyond the boundary 18 along the vertical edges of the gate array cell shown in FIG. 3.

Figure 4:
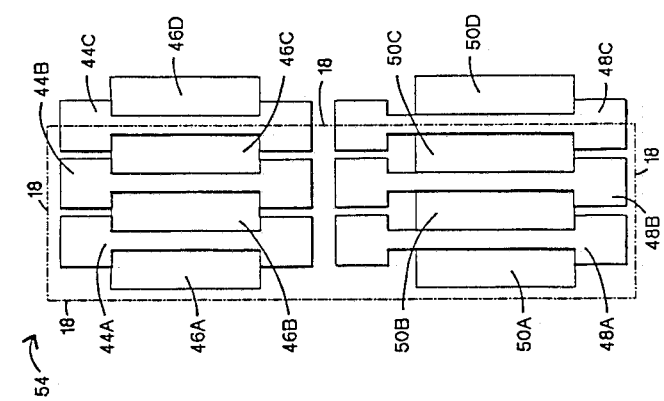
FIG. 4 is a plan view illustrating the topology of a full gate array cell with a cell boundary as defined by the teachings of this invention.

FIG. 4 shows a gate array cell 54 similar to that of FIG. 3 but with the boundary 18 shifted to the left so as to provide a space between the diffusion regions 46A and 50A and the boundary equal to or greater than the given distance indicated in FIG. 2 of the drawings which separates the boundary 18 from the active circuit area border 24, thus, providing at least another ½ ground rule separation between the active circuit area in the gate array cell and the boundary 18 in FIG. 4 of the drawings. It can now be seen that when the gate array cell 54 is placed adjacent on its left side to a standard cell, a full ground rule distance, or two ½ given distances, separates the active circuit area of the standard cell from the active area of the gate array cell 54. Consequently, the gate array cell 54 can now be placed on the right side of an adjacent standard cell without interfering with the circuit function contained within the standard cell. It can also be seen that additional gate array cells having a boundary as indicated in FIG. 4 may be placed in a compatible manner adjacent to the right side of the gate array cell 54 to provide a row of gate array cells of any given length with a standard cell disposed adjacent to and abutting the leftmost gate array cell of the row.

Figure 5:
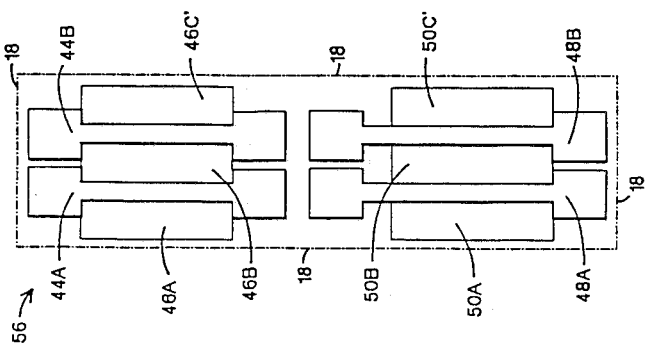
FIG. 5 is a plan view illustrating the topology of an end gate array cell with a cell boundary as defined in FIG. 4 by the teachings of this invention.

FIG. 5 shows a gate array cell 56 similar to that of FIG. 4 but with the rightmost gate electrodes 44C and 48C of FIG. 4 removed and with the rightmost diffusion regions 46D and 50D of FIG. 4 also removed. Thus, the gate array cell of FIG. 5 has only two N-channel transistors which include gate electrodes 44A and 44B and diffusion regions 46A, 46B and 46C' and two P-channel transistors which include gate electrodes 48A and 48B and diffusion regions 50A, 50B and 50C' disposed within the boundary 18. It should be noted that the distance between the rightmost diffusion regions 46C' and 50C' and the boundary 18 should be at least equal to the given distance as discussed in connection with the given distance required between the border 24 of the active circuit area of the standard cell shown in FIG. 2 and the boundary 18. Accordingly, it should be noted that the array cell 56 of FIG. 5, which may be considered as an end gate array cell, can be disposed at its right side adjacent to and abutting a standard cell without interfering with the circuit function contained with the adjacent standard cell. The rightmost diffusion regions 46C' and 50C' of FIG. 5 may extend up to the given distance from the boundary 18 but must be at least wide enough so that an appropriate electrical contact may be made thereto.

Figure 6:
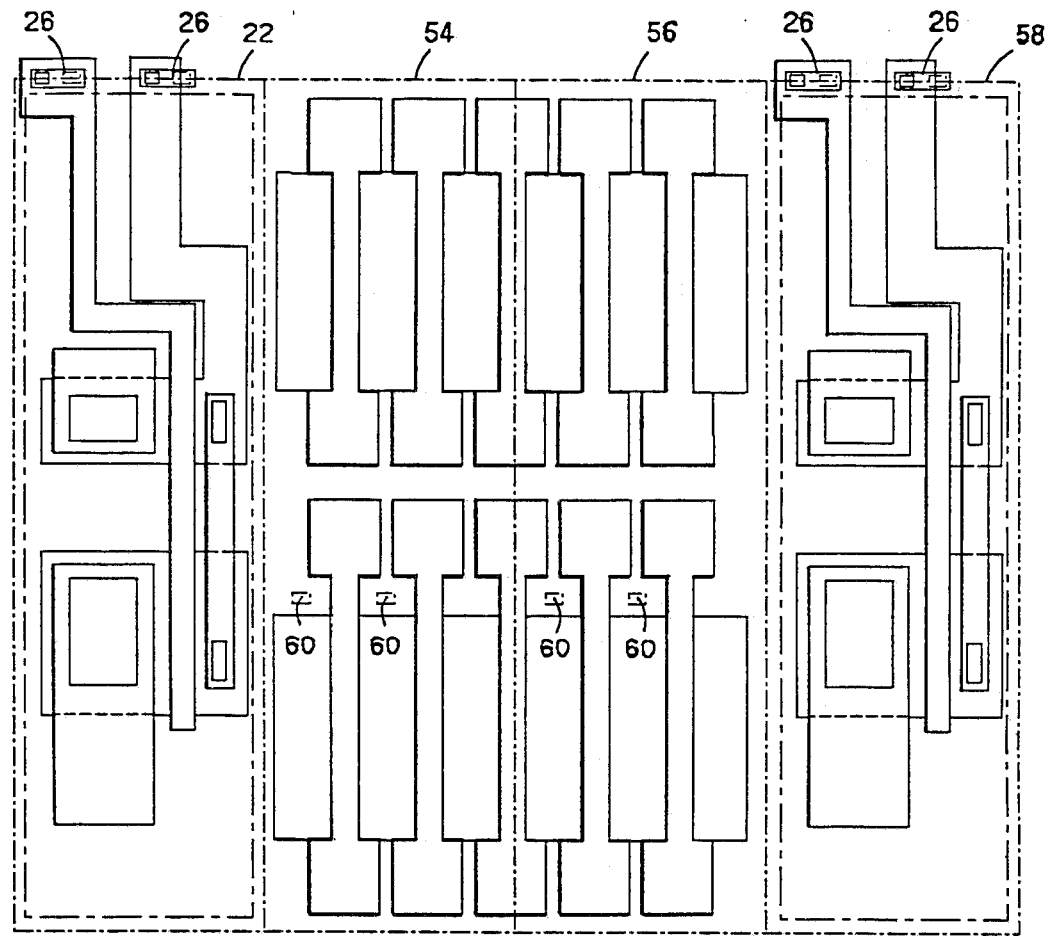
FIG. 6 is a plan view illustrating a mix of standard cells and gate array cells on a common chip arranged in accordance with the teachings of this invention.

FIG. 6 illustrates a mix of the standard cells and the gate array cells on a common chip arranged in a compact manner. The mix of cells shown in FIG. 6 includes the standard cell 22 described in connection with FIGS. 1 and 2 of the drawings, the full gate array cell 54 of FIG. 4, the end gate array cell 56 of FIG. 5 and another standard cell 58 which may be similar to the standard cell 22. From FIG. 6 it can be seen that the mix of cells are compactly arranged so that the standard cell 22 and the full gate array cell 54 have active circuit areas separated from each other by only the ground rule distance and the end gate array cell 56 and the standard cell 58 also have active circuit areas separated from each other by only the ground rule distance. As required, the logic service terminals 26 of the standard cell 22 or 58 may be interconnected with circuits formed in the gate array cells 54 and 56 at logic service terminals 60 of the gate arrays. It should be noted that the mix of standard cells 22 and 58 and gate array cells 54 and 56 shown in FIG. 6 can be used in the inner cell locations 12 of FIG. 1 as indicated at 22, 54, 56 and 58 in FIG. 1.

In view of the compatibility of the gate array cells and the standard cells as arranged in accordance with the teachings of this invention, it can be seen that a standard cell chip can be fabricated in any conventional manner using all necessary standard inner cell locations 12 as indicated in FIG. 1 by the letter S. Thereafter, each of the unfilled inner cell locations 12 as indicated in FIG. 1 by the letter U may be provided with the background transistors of gate array cells. If after testing the circuits of the standard cells, changes are desired, the function of standard cell circuits may be replaced by forming appropriate circuits in the gate array cells and connecting them as necessary to the remaining circuits in the standard cells. Thus, when a circuit modification is identified in the design of a standard cell chip, the standard cell chip need not be completely redesigned or reprocessed. The change may be readily made by using any one or more of the gate array cells by simply making the required connection at the interconnection level of the process. By employing the teachings of this invention, valuable time and expense is saved in the development of highly complex logic chips.

Figure 7:
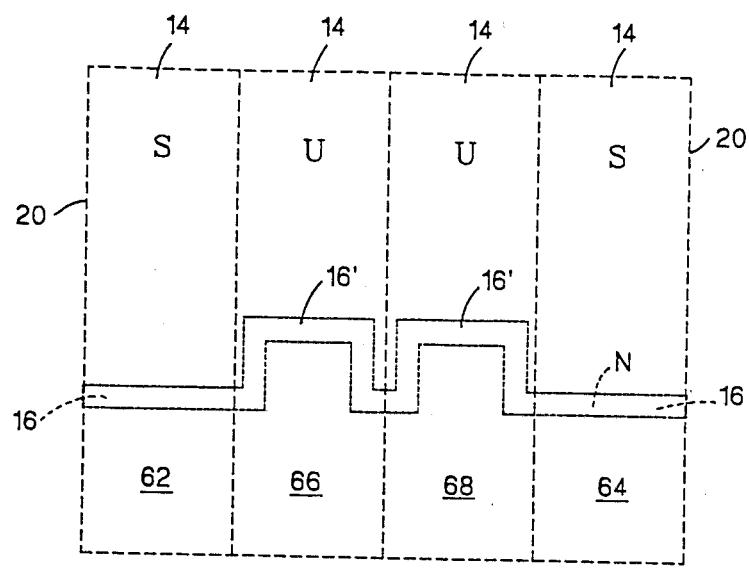
FIG. 7 is a plan view illustrating a mix of standard cell and gate array cell input/output (I/O) circuit locations arranged in accordance with the teachings of this invention.

Referring again to FIG. 1 of the drawings, the guard ring 16, acting as an N-well for attracting minority carriers injected into the body of the chip or substrate 10, which passes through the outer cell locations 14 wherein input/output circuits are formed is positioned with respect to the outer edges of the chip 10 so as to provide sufficient space therebetween to locate two of the outermost transistors of the input/output (I/O) circuits which, being directly connected to an external circuit, may be subjected to large external voltage perturbations. Since the chip 10 is designed initially to accommodate standard cell I/O circuits, the two outermost transistors may be either two N-channel transistors or one N-channel transistor and one P-channel transistor. Accordingly, the standard cell guard ring 16 of FIG. 1 may be located at the same distance from the edge of the chip 10 in all of the outer cell locations 4. However, when one or more of the outer cell locations 4 are unused, such as the outer cell locations identified by the letter U, a region or space is required between the guard ring 16 and the edge of the chip 10 for each of these outer cell locations to contain therein three transistors, two N-channel transistors and one P-channel transistor, for possible use as the two outermost transistors of an input/output (I/O) circuit formed in the gate array cell technology with the remaining transistors of the I/O circuit being disposed in the remaining region of the outer cell location. Accordingly, in each of the unused outer cell locations 14, the guard ring has a U-shaped segment 16' as indicated in FIG. 7 of the drawings which provides additional space between the guard ring and chip edge to accommodate a third transistor, and, of course, an N-well for the P-channel transistor. FIG. 7 illustrates two standard cell outer cell locations 62 and 64 between which are disposed gate array cell outer cell locations 66 and 68. These four locations, 62, 64, 66 and 68, may also be found in the chip 10 of FIG. 1.

Figure 8:
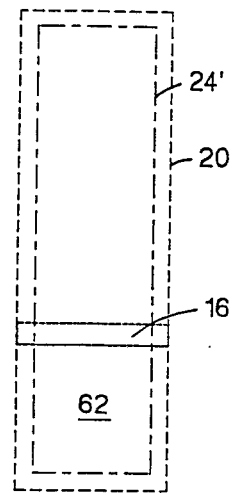
FIG. 8 is a more detailed plan view illustrating one standard cell input/output (I/O) circuit location.

FIG. 8 shows in more detail the standard cell outer cell location 62. It can be seen in FIG. 8 that this outer cell location 62 has an active circuit area 24' with the guard ring 16 passing through the active circuit area 24' and extending between opposite boundary lines 20 of the outer cell location 62.

Figure 9:
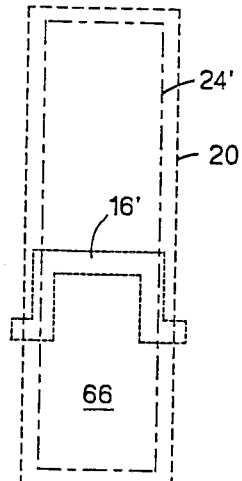
FIG. 9 is a more detailed plan view illustrating one gate array cell input/output (I/O) circuit location.

FIG. 9 shows in more detail the gate array cell outer cell location 66 of FIG. 7. It can be seen that the guard ring 16' of FIG. 9 not only extends through the active circuit area 24' but also extends beyond opposite boundary lines 20 so as to ensure an overlap with the guard ring segments in adjacent outer cell locations 14. Appropriate logic service terminals, not shown, are also provided for the input/output circuits formed in the outer cell locations which are interconnected with other logic service terminals of the inner cell locations containing either standard cells or gate array cells.

Hereinabove has been described the layout of the intermix of standard cells and gate array cells on a common semiconductor chip. Also, as stated hereinabove, design systems are used to form logic chips. A design system flow for creating a standard cell/gate array intermix chip will now be described.

As is known, a design system contains all of the data and software necessary to create the final mask data for a chip, starting from a description of the logic to be implemented, as entred by the user. There are a number of critical elements which the design system must contain. The first of these is data describing a chip image as indicated in FIG. 1, containing an array of cell locations for the placement of logic books or macros internal to the chip, and a row of cells of different dimensions around the perimeter of the chip for the placement of the input/output (I/O) circuits. Two other elements which the design system must contain are descriptions of a gate array and a standard cell library. The gate array library consists of personalization data for each book in the library, where these personalizations are defined on only the conductor and contact levels, so as to interconnect the devices in the gate array background cells. A gate array book personalization may occupy one or more cells on the chip image. In contrast, the standard cell book personalizations contain data on most or all levels in the process, but like a gate array book, may occupy one or more cells on the image.

To begin the design of a chip, the user of the design system defines the logic to be placed on the chip in any known universal logical description language, specifying the interconnections between functions available in either the standard cell and/or the gate array libraries. An automatic placement routine then generates an optimum placement of the books on the chip image, following the cell boundaries specified in the chip image. The placement routine assumes that gate array and standard cell books may be placed in any cell on the chip, given that the cell is not already occupied by a previously placed book.

When a standard cell book is placed on the image, the cells which it occupies, such as indicated at S of FIG. 1, are identified to indicate that fact. Cells where a gate array personalization are to be placed are not so marked. Thus, after placement is completed, another routine in the design system identifies the unmarked cells, such as indicated at U of FIG. 1, and places a gate array background in each of them. In this way, gate array backgrounds may be placed in cell locations having a predefined gate array personality and in all unused cells.

The gate array background placement routine places two different kinds of background cells, depending on the location of surrounding standard cell books. When searching for unmarked cells, the background placement routine identifies continuous groups of such cells, terminated on each end by either a standard cell book, identified as a marked cell, or the end of a cell row. Working from the left end of the group, the routine places full gate array cells as shown in FIG. 4 in all but the rightmost cell in the group. In the rightmost cell, it places an end cell, as shown in FIG. 5. The end cell meets the boundary conditions required by a standard cell book placed to its right. The background placement routine also operates in the input/output (I/O) cell regions 14, placing the background for a gate array input/output (I/O) cell in every cell U of regions 14 of FIG. 1 which has not been marked by the placement of a standard cell input/output (I/O) book. In the I/O regions 14, the routine does not have to distinguish between full and end cells. In this way, an I/O gate array background may be placed in I/O cell locations having a predefined gate array personality and in all unused cells.

However, an additional routine is executed at this point to manipulate the background shapes in the input-/output (I/O) regions 14. The I/O circuits requiring a guard ring 16 of FIG. 1 around the perimeter of the chip, separate the output devices of the I/O circuits from the interior devices of the chip for latchup protection reasons, as stated hereinabove. This guard ring 16, is contained in the chip image, as is consistent with the layout requirements of the standard cell I/O circuits. The manipulation routine looks for input/output (I/O) cells marked as containing a standard cell personality and leaves them as is. However, in unmarked cells, U of FIG. 1, the manipulation routine deletes the original guard ring shape, and replaces it with a modified shape 16' contained in the gate array background, as indicated in FIG. 9. This shape is modified as stated hereinabove to allow more space for additional devices to be placed in the output device region between the guard ring 16' and the edge of the chip 10.

Having placed all of the background shapes required to define the device build levels of the chip, the design system then stores the placement information for all of the books placed to that point for future reference, and prepares the data for the so-called front end of the line levels in the process for mask generation. The masks are created from this data and may now be used for the processing of wafers.

The logic designer may at this point, as necessary or desired, define more logic books and macros to be placed on the chip, using functions only from the gate array library. These functions are added to the logical description used above. When the logic design is completed, the designer enters a second phase of placement, adding to the placement data stored from the previous pass. The new books are placed on the image wherever unused cells are available, knowing that the gate array background placement routine has ensured that these cells contain gate array backgrounds.

Once all of the books have been placed after the second pass, a wiring routine is used which connects together all of the books following the logical description, using global wires in the image to connect the logic service terminals (LSTs), such as at 26 in FIG. 2, of a book to the LSTs, such as at 60 in FIG. 6, of other books. This wiring data is combined with the gate array personalization data and the contact and conductor levels from the standard cell books to form the data for masks to be used in the so-called back end of the manufacturing line. These masks are generated and sent to the manufacturing line for completion of the wafer processing. At this point, all of the data from the chip placement and wiring is also stored for use, if a later modification to the design is required.

Modifications to the design are made by deleting previously used gate array functions, by deactivating standard cell functions, and/or by adding gate array-only books. When a gate array book is deleted from the design, the cells from which the book was deleted become available as unused cells.

For standard cell books which are to be deactivated, the design system recalls the placement and wiring information and deactivates the books by deleting the wires connecting to their LSTs and disabling the input LSTs by connecting them to an appropriate logic level using tie-up or tie-down books. A tie-up book provides an LST connected to a logical high value or logical "1" value, and a tie-down book provides a similar LST connected to a logical low value or logical "0" value. Output LSTs on deleted books may be ignored or are terminated on a load book, which performs no logical function. Tie-up, tie-down, and load books are all gate array functions, so that they may be used in the second pass of the design in any previously unoccupied cell.

When a gate array book is added to the design, it is placed in any previously unused cell, where a gate array background is known to already exist. It is also automatically wired into the design, using a global wiring routine.

Having completed the modifications to the design, the designer may now generate a new set of only the back end of the line masks to create the modified chips.

There are a number of design options available to the design system user consistent with the above design flow. The first of these is a standard cell-only design, where only standard cell functions are used in defining the chip's logic. In this instance, the gate array background placement routine is still employed, transparent to the user, so that modifications to the design can be made later, using the methodology described above. In this design, the second pass placement for gate array books is not used, and instead, front end of the line and back end of the line masks are submitted together.

A second option available to the designer is a gate array-only chip, where only gate array functions are used. In this case, none of the cells are marked by standard cell books, so they all receive gate array backgrounds. A standard set of front end of the line masks was previously submitted for this type of design, and only the back end of the line masks are personalized, as is normal for gate array designs.

A third design option that may be used is where standard cell-only books or macros are defined for the first pass of a design, and front end of the line masks are submitted reflecting their placement. The logic design is then completed using gate array-only functions, allowing the back end of the line masks to be submitted sometime later after the front end of the line levels are processing. This option allows the designer the maximum flexibility in chip density and performance as well as logic design turn-around-time, as the designer may use standard cell macros to obtain the maximum density and performance on critical parts of the chip, while maintaining gate array turn-around-time on the remainder of the design.

It should be noted that the full gate array cell in FIG. 4 includes three pairs of CMOS devices, however, if desired, the cell may have more or fewer pairs of devices. Also, the end cell, as shown in FIGS. 5 and 6, has been disclosed as being placed at the right end of a row of gate array cells, but, of course, the row could include all full gate array cells with the end cell of FIG. 5 being located at the left end of the row with the full and end gate array cells being designed in the mirror image of the gate array cells shown in FIGS. 4 and 5, respectively, of the drawings.

Although standard cells and gate array cells are disclosed hereinabove as being intermixed, it should be understood that any combination of cells or macros can be mixed on a common semiconductor substrate or chip in accordance with the teachings of this invention so long as the full cell at one end of a row of such given cells normally containing active circuit areas from one cell boundary to an opposite cell boundary, as does the gate array cell, has its boundary shifted so as to provide a ½ ground rule space between its boundary and its active circuit area and a ½ ground rule space is provided between the boundary and active circuit area of an end cell in the row of such given cells located at the end of the row of such given cells opposite the one end.

It should also be noted that the invention is not limited to cells arranged in a row but also applies to a column or other linearly arranged succession of cells.

While the invention has been particularly shown and described with reference to preferred embodiments thereof, it will be understood by those skilled in the art that various changes in form and details may be made therein without departing from the spirit and scope of the invention.

What is claimed is:

1. A method of making a logic chip which includes the steps of
   defining a plurality n of cell locations, each having a boundary, within a semiconductor chip,
   forming standard cell circuits within n-x of said plurality n of cell locations, where x is a smaller number than n, x cell locations being unoccupied, each of said standard cell circuits being disposed within an active circuit area spaced at least a given distance from the boundary of its associated cell location, and
   forming a plurality of gate array cells within said unoccupied cell locations, each of said gate array cells having an active circuit area spaced at least said given distance from the boundary on one side of its associated cell location and extending without the boundary on the side of its associated cell location opposite to that of said one side for a distance at least equal to said given distance for contacting the active circuit area of an adjacent one of said plurality of gate array cells and extending within said opposite boundary so as to be spaced therefrom by at least said given distance when one of said standard cells is disposed adjacent to said opposite boundary.

2. A method as set forth in claim 1 further including the steps of
   forming a plurality of input/output cell locations along the periphery of said chip, a first plurality of said input/output cell locations having an isolation region spaced from the edge of said chip by a first distance and a second plurality of said input/output cell locations having an isolation region spaced from the edge of said chip by a second distance different from that of said first distance.

3. A method as set forth in claim 2 wherein said isolation regions form a guard ring dividing each of said input/output cell locations into first and second regions.

4. A method as set forth in claim 3 further including the steps of
forming input/output circuits having a plurality of transistors in each of said input/output cell locations, said first region of each of said input/output cell locations having formed therein at least one of said transistors with the remaining transistors being formed within said second regions.

5. A method of making a logic chip which includes the steps of
defining a plurality n of cell locations, each having a boundary, within a semiconductor chip,
forming a plurality n-x standard cells within n-x of said plurality n of cell locations, where x is a smaller number than n, x cell locations being unoccupied, each of said standard cells having an active circuit area disposed at least a given distance from the boundary of its associated cell location, and
forming a plurality of gate array cells within said unoccupied cell locations, said plurality of gate array cells being equal to or less than x, each of said gate array cells having an active circuit area disposed at least said given distance from the boundary on one side of its associated cell location and extending without the boundary on the side of its associated cell location opposite to that of said one side for a distance at least equal to said given distance to contact the active circuit area of an adjacent one of said plurality of gate array cells and extending to within said opposite boundary no closer than at least said given distance when one of said standard cells is disposed adjacent to said opposite boundary.

6. A method of making a logic chip which includes the steps of
defining a plurality of contiguous cell locations, each having a boundary, within a semiconductor chip,
forming first and second standard cell circuits in spaced apart first and second cell locations, respectively, of said plurality of cell locations, each of said standard cell circuits being disposed within an active area of its associated cell location spaced at least a given distance from the boundary of its associated cell location,
forming a first gate array cell in a third cell location of said plurality of cell locations contiguous with said first cell location between said first and second cell locations, said first gate array cell having an active circuit area spaced at least a given distance from the common boundary between said first and third cell locations, and
forming a second gate array cell in a fourth cell location of said plurality of cell locations contiguous to said second cell location between said first and second cell locations, said second gate array cell having an active circuit area spaced at least said given distance from the common boundary between said second and fourth cell locations.

7. A method as set forth in claim 6 wherein said first gate array cell includes a given number of source/drain diffusion regions of a first conductivity type within its cell location boundary and one source/drain diffusion region without its cell location boundary and said second gate array cell includes only said given number of source/drain diffusion regions of said first conductivity type within its cell location boundary.

8. A method as set forth in claim 7 further including the step of
forming a row of gate array cells similar to said first gate array cell between said first and second gate array cells.

9. A method as set forth in claim 8 wherein said one source/drain diffusion region of said first gate array cell overlaps a source and drain region of one of the gate array cells of said row of gate array cells and the one source/drain diffusion region of another of the gate array cells of said row of gate array cell overlaps one of said source/drain diffusion regions of said second gate array cell.

10. A method as set forth in claim 7 wherein said first gate array cell further includes said given number of source/drain diffusion regions of a second conductivity type within its cell location boundary and one source/drain diffusion region of said second conductivity type without its cell location boundary and said second gate array cell further includes only said given number of source/drain diffusion regions of said second conductivity type within its cell location boundary.

11. A method as set forth in claim 10 wherein both P-channel and N-channel transistors are formed in each of said gate array cells.

12. A method as set forth in claim 7 wherein said one source/drain diffusion region of said first gate array cell overlaps one of said source/drain diffusion regions of said second gate array cell.

13. A method as set forth in claim 6 further including the step of
forming insulating regions between the active circuit areas of said first and third cell locations and between the active circuit areas of said second and fourth cell locations.

14. A method as set forth in claim 6 further including the step of
forming a row of gate array cells similar to said first gate array cell between said first and second gate array cells.

15. A method as set forth in claim 6 further including the steps of
forming electrical contacts within said first, second, third and fourth cell locations.

16. A method as set forth in claim 6 further including the step of
forming a plurality of input/output cell locations along the periphery of said chip, a first plurality of said input/output cell locations having an isolation region spaced from the edge of said chip by a first distance and a second plurality of said input/output cell locations having an isolation region spaced from the edge of said chip by a second distance longer than said first distance.

17. A method as set forth in claim 16 wherein said isolation regions form a guard ring dividing each of said input/output cell locations into first and second active circuit regions.

18. A method as set forth in claim 17 further including the step of forming gate array cells in each input- /output cell of said second plurality of input/output cells.

19. A method as set forth in claim 18 further including the steps of forming input/output circuits having a plurality of transistors in each of said input/output cell locations, said first region of each of said input/output cell locations having formed therein at least one of said transistors with the remaining transistors being formed within said second regions.

20. A method as set forth in claim 19 wherein said first regions are formed between said isolation regions and the edge of said chip and further including the step of forming three field effect transistors in each of the first regions of said second plurality of cell locations and two field effect transistors in each of the first regions of said first plurality of cell locations.

21. A method as set forth in claim 20 wherein said three field effect transistors include a P channel transistor and two N-channel transistors.

22. A method as set forth in claim 21 wherein each of said two field effect transistors is an N channel transistor.

23. A method as set forth in claim 21 wherein one of said two field effect transistors is an N channel transistor and the other of said two field effect transistors is a P channel transistor.

24. A method of making a logic chip which includes the steps of defining a plurality of contiguous cell locations, each having a boundary, within a semiconductor chip, forming a first and second cell of a first type in spaced apart first and second cell locations, respectively, of said plurality of cell locations, each of said first and second cell locations having an active circuit area spaced a given distance from the boundary of its associated cell location, forming a first cell of a second type in a third cell location contiguous with said first cell location between said first and second cell locations, the first cell of said second type having an active circuit area spaced at least a given distance from the common boundary between said first and third cell locations and extending to at least the boundary of said third cell location on its opposite side, and forming a second cell of said second type in a fourth cell location of said plurality of cell locations between said first and second cell locations, said second cell of said second type having an active circuit area spaced at least said given distance from the common boundary between said second and fourth cell locations and extending to at least the boundary of said fourth cell location on its opposite side.

25. A method as set forth in claim 24 further including the step of forming a plurality of input/output cell locations along the periphery of said chip, a first plurality of said input/output cell locations having a diffused isolation region spaced from the edge of said chip by a first distance and a second plurality of said input/output cell locations having a diffused isolation region spaced from the edge of said chip by a second distance longer than said first distance.

26. A method as set forth in claim 25 wherein said diffused isolation regions form a guard ring extending through said plurality of input/output cell locations.

27. A method as set forth in claim 26 wherein said guard ring includes N type impurities and said semiconductor chip includes P type impurities.

* * * * *